United States Patent
Coumou

(10) Patent No.: US 12,183,548 B2
(45) Date of Patent: Dec. 31, 2024

(54) HIGH BANDWIDTH ARCHITECTURE FOR CENTRALIZED COHERENT CONTROL AT THE EDGE OF PROCESSING TOOL

(71) Applicant: Applied Materials, Inc., Santa Clara, CA (US)

(72) Inventor: David Coumou, Webster, NY (US)

(73) Assignee: Applied Materials, Inc., Santa Clara, CA (US)

( * ) Notice: Subject to any disclaimer, the term of this patent is extended or adjusted under 35 U.S.C. 154(b) by 213 days.

(21) Appl. No.: 17/737,659

(22) Filed: May 5, 2022

(65) Prior Publication Data

US 2023/0360885 A1   Nov. 9, 2023

(51) Int. Cl.
*H03H 7/38* (2006.01)
*G01R 19/00* (2006.01)
*H01J 37/32* (2006.01)
*H03H 7/40* (2006.01)

(52) U.S. Cl.
CPC ...... *H01J 37/32183* (2013.01); *G01R 19/003* (2013.01); *G01R 19/0061* (2013.01); *H03H 7/40* (2013.01)

(58) Field of Classification Search
CPC ....... H03H 7/38; H03H 7/40; H01J 37/32183; H01J 37/32
USPC ................................................ 333/17.1, 17.3
See application file for complete search history.

(56) References Cited

U.S. PATENT DOCUMENTS

| 9,480,140 | B2* | 10/2016 | Nam | H01J 37/32366 |
| 2012/0000888 | A1* | 1/2012 | Kawasaki | H03H 7/38 |
| | | | | 333/17.3 |
| 2015/0244342 | A1 | 8/2015 | Shimomoto et al. | |
| 2020/0286720 | A1 | 9/2020 | van Greunen et al. | |
| 2020/0411288 | A1 | 12/2020 | Wang et al. | |

FOREIGN PATENT DOCUMENTS

| JP | 5496506 B2 | 5/2014 |
| WO | 2020081827 A1 | 4/2020 |

OTHER PUBLICATIONS

International Search Report and Written Opinion from PCT/US2023/018707 dated Jul. 31, 2023, 11 pgs.
International Preliminary Report on Patentability for International Application No. PCT/US2023/018707, dated Nov. 14, 2024, 7 pages.

* cited by examiner

*Primary Examiner* — Hai L Nguyen
(74) *Attorney, Agent, or Firm* — Schwabe, Williamson & Wyatt, P.C.

(57) ABSTRACT

Embodiments disclosed herein include a processing tool. In an embodiment, the processing tool comprises a power supply, an impedance matching network coupled to the power supply, a cathode, wherein the power supply is configured to supply power through the impedance matching network to the cathode, and a processing module, wherein the processing module is communicatively coupled to the power supply and the impedance matching network.

18 Claims, 9 Drawing Sheets

HIGH BANDWIDTH ARCHITECTURE FOR CENTRALIZED COHERENT CONTROL AT THE EDGE OF PROCESSING TOOL

BACKGROUND

1) Field

Embodiments relate to the field of semiconductor manufacturing and, in particular, to a control system for impedance matching in a semiconductor processing tool.

2) DESCRIPTION OF RELATED ART

In plasma processing tools, the plasma is ignited by a cathode that is coupled to processing gasses within a chamber. In most tools, a power supply is coupled to the cathode through an impedance matching network (sometimes referred to simply as a "match"). The match allows for the impedance of the system to be adjusted in order to match the impedance of the load to which the cathode is coupled. The load has a wide range of impedances that are dictated by parameters such as processing conditions, chamber architecture, and the like. Matching the impedances is important in order to provide efficient power transfer from the power supply to the load.

Generally, matching networks are controlled with a distributed control architecture. In such systems, control is established local to the system and respective sub-system. Interactions between the systems occur over a network. Networked devices have reduced control bandwidth, large group delays, and limited peer-to-peer coordination. Localized schemes inhibit higher degree coherency between coupled systems.

SUMMARY

Embodiments disclosed herein include a processing tool. In an embodiment, the processing tool comprises a power supply, an impedance matching network coupled to the power supply, a cathode, wherein the power supply is configured to supply power through the impedance matching network to the cathode, and a processing module, wherein the processing module is communicatively coupled to the power supply and the impedance matching network.

Embodiments disclosed herein may further comprise a process power control module. In an embodiment, the process power control module comprises an RF platform board, a carrier card for an analog to digital converter (ADC), a heterogeneous computing module (HCM), a programmable logic board, a real time processing unit (RTPU), and a messaging controller.

Embodiments disclosed herein may further comprise a semiconductor processing tool. In an embodiment, the semiconductor processing tool comprises a power supply, an impedance matching network coupled to the power supply, a cathode, wherein the power supply is configured to supply power through the impedance matching network to the cathode, and a processing module, wherein the processing module is communicatively coupled to the power supply and the impedance matching network, and wherein the processing module comprises, an RF platform board, a carrier card for an analog to digital converter (ADC), a heterogeneous computing module (HCM), a programmable logic board, a real time processing unit (RTPU), and a messaging controller.

DETAILED DESCRIPTION

Systems described herein include a semiconductor processing tool that includes a control system for impedance matching in the semiconductor processing tool. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, there are deficiencies in existing control of power sources and the associated impedance matching networks. In an embodiment there are different architectures that enable coherent control of the power delivery. In an embodiment, the power delivery is controlled by a controller. The controller receives feedback from sensors that are provided before and after the impedance matching network. For example, the sensors may be current and voltage sensors. The sensor information can then be used in order to actuate variable capacitors in the match in order to match the impedance of the load.

Embodiments are flexible in order to account for different power delivery architectures. For example, one, two, three, or more power sources may be fed into the match, and one, two, or more outputs may be fed out from the match. In this way, there is flexibility to meet the power delivery architectures in accordance with various embodiments.

Figure 1:
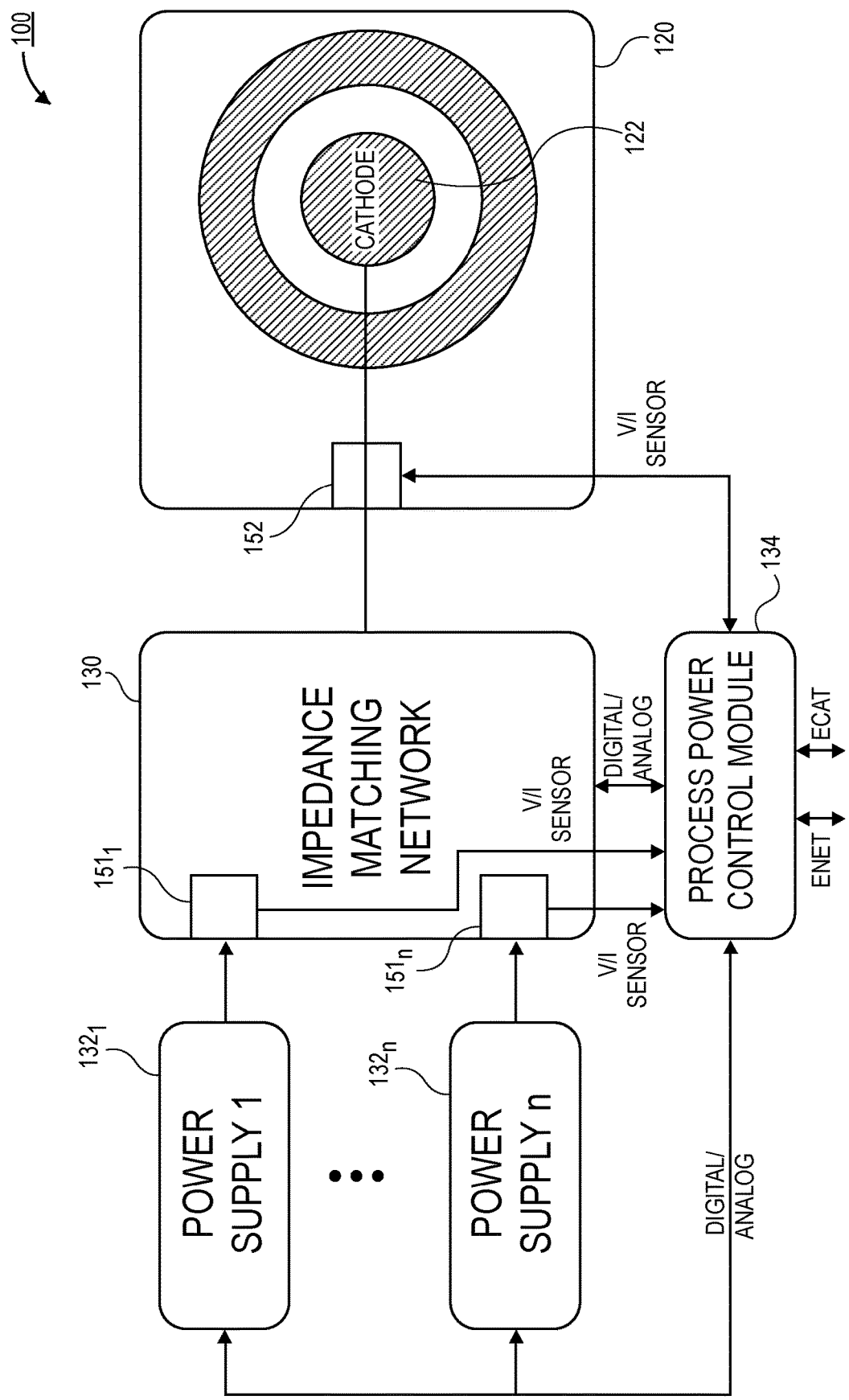
FIG. 1 is a schematic of a plasma processing tool that includes a centralized control architecture, in accordance with an embodiment.

Referring now to FIG. 1, a schematic of a plasma processing tool 100 is shown, in accordance with an embodiment. In an embodiment, the plasma processing tool 100 includes a plasma chamber 120. The plasma chamber 120 includes a cathode 122 in order to couple the power received to one or more gasses flown into the plasma chamber 120. In an embodiment, the plasma chamber 120 may be suitable for any plasma process typical of semiconductor manufacturing environments. For example, the plasma chamber 120 may be a plasma etching chamber, a plasma deposition chamber, a plasma treatment chamber, or the like. In a particular embodiment, the plasma chamber 120 may be a plasma enhanced chemical vapor deposition (PECVD) chamber, a physical vapor deposition (PVD) chamber, or a plasma enhanced atomic layer deposition (PEALD) chamber.

In an embodiment, the plasma chamber 120 may be coupled to a power delivery architecture. For example, the power delivery architecture may include one or more power supplies $132_1$-$132_n$. In the illustrated embodiment, a plurality of power supplies 132 are shown. However, it is to be appreciated that a single power supply 132 may be used in some embodiments. In an embodiment, the power supplies 132 may include any type of power supply. For example, the power supplies 132 may be RF power supplies, microwave power supplies, direct current (DC) power supplies, pulsed DC power supplies, or the like.

In an embodiment, the power supplies 132 may be coupled to the cathode 122 through an impedance matching network 130. The impedance matching network 130 alters the impedance of the power delivery architecture in order to match the load in the chamber 120. Due to changes in processing conditions (e.g. gas flow rates, pressure, temperature, etc.) the impedance of the load can vary. As such, the impedance matching network 130 is used to match the changing impedance in order to provide efficient power delivery into the chamber (i.e., with no or minimal reflected power).

In an embodiment, sensors 151 and 152 may be provided on opposite ends of the impedance matching network 130. For example, sensors $151_1$-$151_n$ may be on an upstream side of the impedance matching network 130, and sensor 152 may be on a downstream side of the impedance matching network 130. The "upstream" side may refer to the input side of the matching network 130, and the "downstream" side may refer to the output side of the matching network 130. As shown, a plurality of sensors $151_1$-$151_n$ are provided on the upstream side of the impedance matching network 130. The number of sensors 151 may be equal to the number of power supplies 132. That is, each power supply 132 may have a dedicated sensor 151. The downstream side of the impedance matching network 130 may have a single sensor 152. However, it is to be appreciated that when there is more than one output from the matching network 130, there may be additional sensors 152. For example, in a case where there is two outputs (e.g., for a center of the chamber 120 and an edge of the chamber 120), there may be two sensors 152.

In an embodiment, the sensors 151 and 152 may be any suitable sensor architecture that can be used to monitor the flow of power from the power supplies 132 to the cathode 122. In a particular embodiment, the sensors 151 and 152 are sensors for detecting voltage (V) and current (I). In an embodiment, the sensors 151 are coupled to electromagnetic signals on a power coupling transmission line. The power delivery cables (e.g., wires, etc.) pass through a center of the ring.

In an embodiment, the sensors 151 and 152 may be communicatively coupled with a processing module 134. As shown, a process power control module 134 is provided in FIG. 1. However, it is to be appreciated that the processing module may be a microwave processing module 134, a DC processing module, or the like, depending on what type of power supplies 132 are included in the tool 100. In an embodiment, the sensors 151 and 152 deliver the voltage and/or current to the processing module 134. In an embodiment, the processing module 134 may have external connections, such as an ENET and an ECAT connection.

In an embodiment, the processing module 134 may be coupled to the impedance matching network by an analog/digital link. Through the analog/digital link, the processing module 134 may be able to send control signals to the impedance matching network 130. For example, control signals may be used to adjust the capacitance of variable capacitors within the impedance matching network 130. Additionally, the processing module 134 may be coupled to the power supplies 132 by an analog/digital link. As such, the processing module 134 is capable of coordinated impedance tuning. In an embodiment, the analog/digital links may have corresponding transceivers on each end of the link.

Figure 2A:
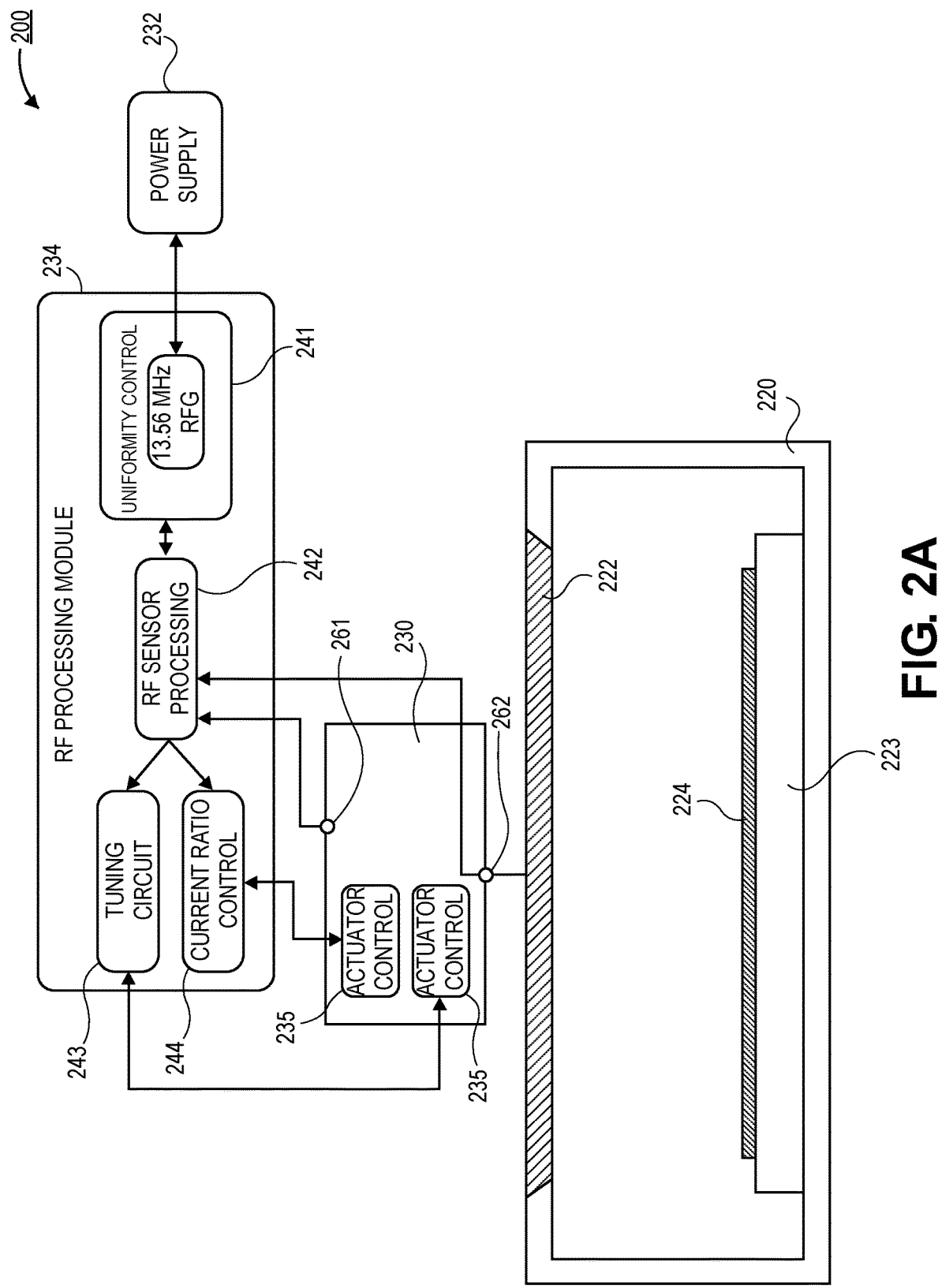
FIG. 2A is a schematic of a plasma processing tool that includes a process power control module that is coupled to a matching network that is connected to a top cathode in the plasma processing tool, in accordance with an embodiment.

Referring now to FIG. 2A, a schematic illustrations of a semiconductor processing tool 200 is shown, in accordance with an additional embodiment. As shown, the processing tool 200 may comprise a chamber 220. A top electrode 222 may be provided as a lid to the chamber 220. A pedestal 223 for supporting a substrate 224 may be provided within the chamber 220. In an embodiment, the substrate 224 may be a semiconductor wafer or any other substrate typical of semiconductor processing operations. In an embodiment, the top electrode 222 may be coupled to a power delivery architecture.

In an embodiment, the power delivery architecture may include a power supply 232. The power supply 232 may be an RF power supply, a microwave power supply, a DC power supply, a pulsed DC power supply, or the like. In an embodiment, the power supply 232 may be coupled to a processing module 234. In a particular embodiment, the power supply 232 may be a 13.56 MHz RF power supply. In an embodiment, the processing module 234 may comprises a current control module 241. Additionally, the processing module may comprise an RF sensor processing block 242. The RF sensor processing block 242 may include circuitry for receiving and interpreting outputs from sensors 261 and 262. In an embodiment, sensor 261 may be at the upstream side of the impedance matching network 230, and sensor 262 may be at a downstream side of the impedance matching network 230. The sensors 261 and 262 may be current and voltage sensors.

In an embodiment, the processing module 234 may further comprise a tuning circuit 243 and a uniformity control block 244. The tuning circuit 243 and the uniformity control block 244 may be communicatively coupled to actuator controllers 235 in the impedance matching network 230. The actuator controllers 235 may be actuated in order to change the capacitance of variable capacitors within the impedance matching network 230 in order to control the impedance through the impedance matching network 230. In a particular embodiment, the capacitors are mechanical capacitors. In other embodiments, the capacitors are solid state capacitors.

Figure 2B:
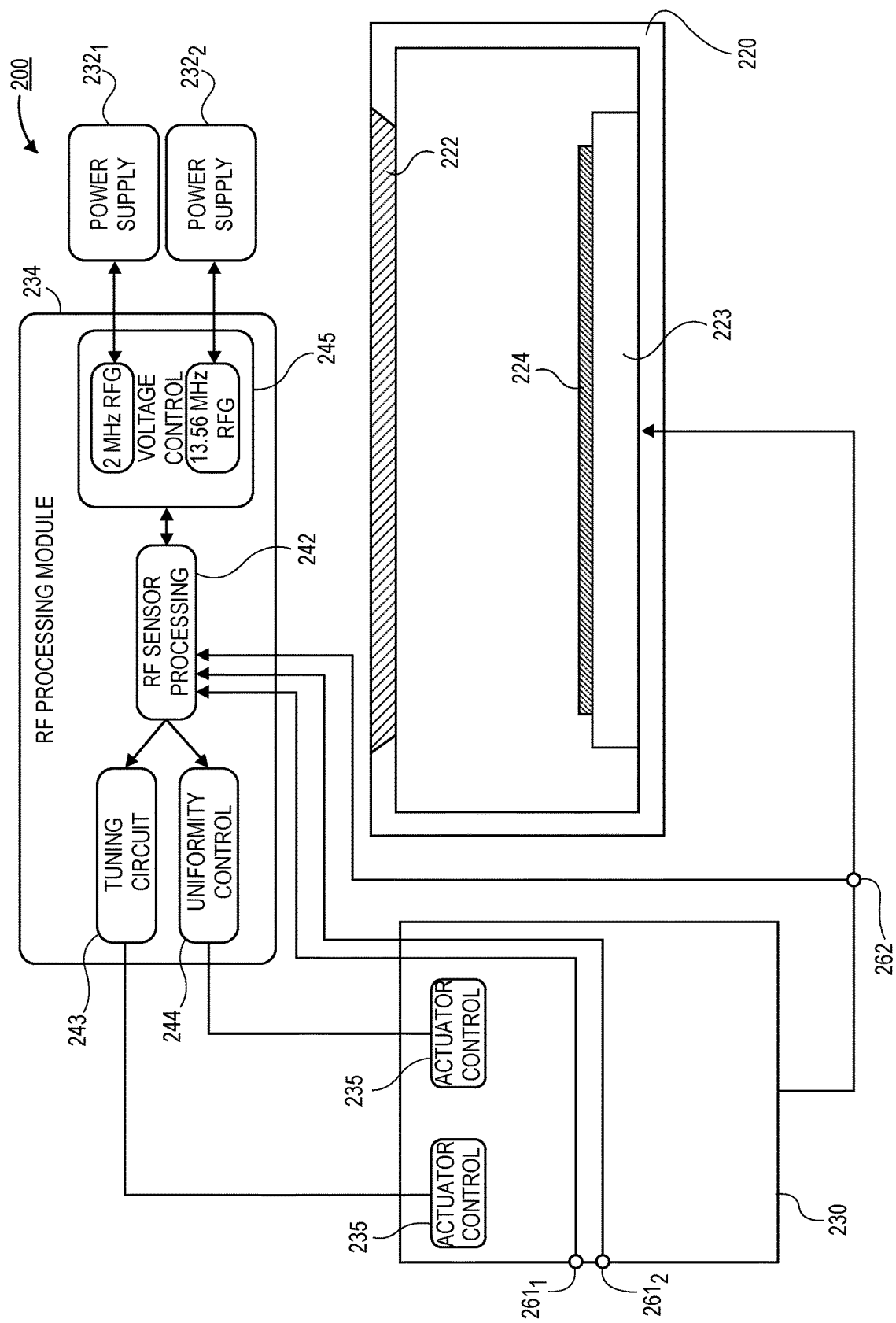
FIG. 2B is a schematic of a plasma processing tool that includes a process power control module that is coupled to a bias source at the substrate support in the plasma processing tool, in accordance with an embodiment.

Referring now to FIG. 2B, a schematic of a semiconductor processing tool 200 is shown, in accordance with an additional embodiment. In an embodiment, the processing tool 200 may include a chamber 220. A top electrode 222 may be provided as a lid to the chamber 220. In an embodiment, a pedestal 223 for supporting a substrate 224 may be at a bottom of the chamber 220. In a particular embodiment, the pedestal 223 may be coupled to one or more power supplies 232. In the embodiment shown in FIG. 2B, the semiconductor processing tool 200 may comprise a first power supply 2321 and a second power supply 2322. Though it is to be appreciated that one or more power supplies 232 may be used in different embodiments.

In an embodiment, the power supplies 232 may be coupled to processing module 234. For example, the power supplies 232 may feed into a voltage controller 245. For example, the first power supply 2321 may be a 2 MHz RF power supply, and the second power supply 2322 may be 13.56 MHz RF power supply.

In an embodiment, the voltage control block 245 may be coupled to a sensor processing block 242. In an embodiment, the sensor processing block 242 may be communicatively coupled to a plurality of sensors. For example, a pair of first sensors 2611 and 2622 may be at an upstream side of the impedance matching network 230. The first sensors 2611 and 2612 may be sensors for the inputs of the first power supply 2321 and the second power supply 2322 into the impedance matching network 230. In an embodiment, the second sensor 262 may be at a downstream side of the impedance matching network 230. The first sensors 261 and the second sensor 262 may be current and voltage sensors, such as those described in greater detail above.

In an embodiment, a tuning circuit 243 and a current ratio control block 244 may be communicatively coupled to the sensor processing block 242. The tuning circuit 243 and the current ratio control block 244 may be communicatively coupled to actuator controllers 235 in the impedance matching network 230. The actuator controllers 235 may be actuated in order to change the capacitance of variable capacitors within the impedance matching network 230 in order to control the impedance through the impedance matching network 230. In a particular embodiment, the capacitors are mechanical capacitors. In other embodiments, the capacitors are solid state variable impedance devices.

In FIG. 2A the power delivery architecture is coupled to the top electrode, and in FIG. 2B the power delivery architecture is coupled to the bottom pedestal. However, in other embodiments, it is to be appreciated that a power delivery architecture may be coupled to both the top electrode and the bottom pedestal. In such an embodiment, a pair of power delivery architectures may be used, one for the top electrode and one for the bottom pedestal.

Figure 2C:
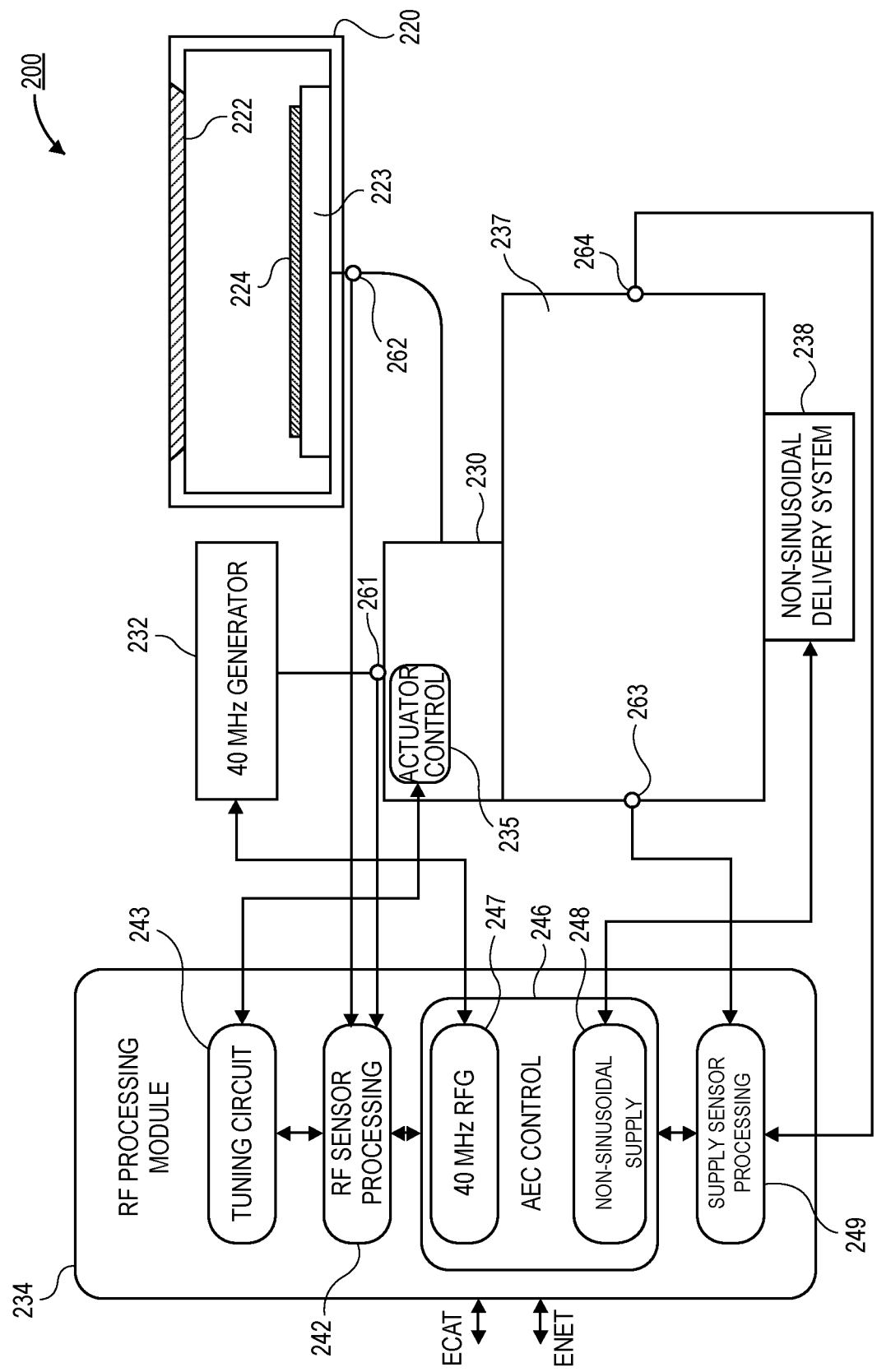
FIG. 2C is a schematic of a plasma processing tool that includes a matching network for RF control and non-sinusoidal control in the plasma processing tool, in accordance with an embodiment.

Referring now to FIG. 2C, a schematic illustration of a semiconductor processing tool 200 is shown, in accordance with an additional embodiment. In an embodiment, the semiconductor processing tool 200 includes a chamber 220. The chamber is sealed by a top electrode 222. In an embodiment, a pedestal 223 may be provided at a bottom of the chamber 220. The pedestal 223 is configured to hold a substrate 224.

In an embodiment, a processing module 234 may be coupled to the chamber 220. In an embodiment, the processing module 234 may be a process power control module, though other power sources may be used (e.g., microwave, DC, etc.). In an embodiment, the processing module 234 may be coupled to two or more power supplies. For example, the AEC control 246 may have block 247 that is coupled to an RF generator 232 (e.g., a 40 MHz generator), and a block 248 that is coupled to a non-sinusoidal supply delivery system 238.

In an embodiment, non-sinusoidal supply sensor processing block 249 may be coupled to sensors on the non-sinusoidal supply match 237. For example, the sensors may include a first sensor 263 and a second sensor 264. The first sensor 263 may provide readings of the edge voltage and the edge current. The second sensor 263 may provide readings of the wafer voltage and the wafer current.

In an embodiment, the RF sensor processing block 242 may also be coupled to a pair of sensors. For example, a first sensor 261 may be on an upstream side of the RF impedance matching device 230 and the second sensor 262 may be on a downstream side of the RF impedance matching device 230. The downstream side of the RF match may be coupled to the pedestal 223. In an embodiment, the first sensor 261 and the second sensor 262 may be current and voltage sensors.

In an embodiment, the process power control module 234 may further comprise a tuning circuit 243. The tuning circuit 243 may be coupled to a motor control 235 in the RF match 230. The tuning circuit 243 may be used to adjust the impedance in the RF match 230. For example, the motor control 235 may adjust the positioning of one or more variable capacitors in order to alter the impedance of the system.

Referring now to FIGS. 3A-3D, a series of schematic illustrations of processing tools 300 is shown, in accordance with various embodiments. In the illustrated embodiments, various inputs and outputs are provided into/out of the impedance matching network 330. Additionally, circuit architectures within the impedance matching network 330 are shown.

Figure 3A:
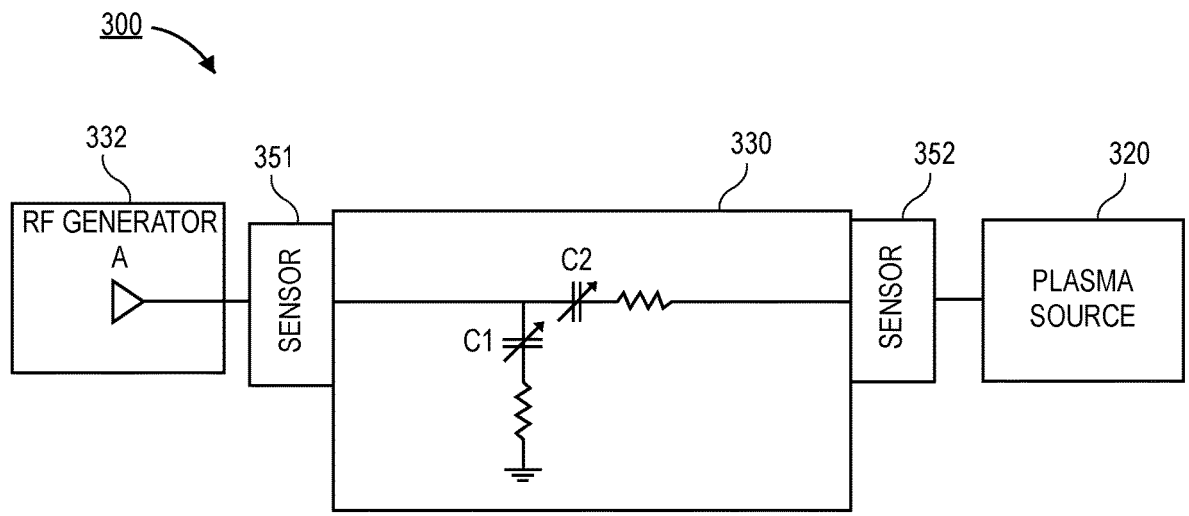
FIG. 3A is a schematic of a plasma processing tool with a single power supply with a single output, in accordance with an embodiment.

Referring now to FIG. 3A, a semiconductor processing tool 300 is shown, in accordance with an embodiment. In an embodiment, the semiconductor processing tool 300 comprises a power supply 332. The power supply 332 shown in FIG. 3A is an RF generator. Though, it is to be appreciated that other power supplies may be used in accordance with additional embodiments. In an embodiment, the power supply 332 may be coupled to a first sensor 351. The first sensor 351 may be on an upstream side of the impedance matching network 330. In an embodiment, the first sensor 351 is a voltage and current sensor. In an embodiment, the first sensor 351 may be followed by the impedance matching network 330.

The impedance matching network 330 may include a first capacitor C1 and a second capacitor C2. The first capacitor C1 and the second capacitor C2 may be variable capacitors. The first capacitor C1 may be between an input to the impedance matching network 330 and a ground. The second capacitor C2 may be between the input to the impedance matching network 330 and an output of the impedance matching network 330.

In an embodiment, the output of the impedance matching network 330 may be coupled to a second sensor 352. The second sensor 352 may be a voltage and current sensor. In an embodiment, the first sensor 351 and the second sensor 352 may be coupled to a processing module (not shown) similar to the process power control modules described in greater detail above. In an embodiment, the second sensor 352 may be between the impedance matching network 330 and the plasma source 320. For example, the plasma source 320 may be a plasma processing chamber, such as a PECVD chamber, a PEALD chamber, a PVD chamber, or a plasma treatment chamber.

Figure 3B:
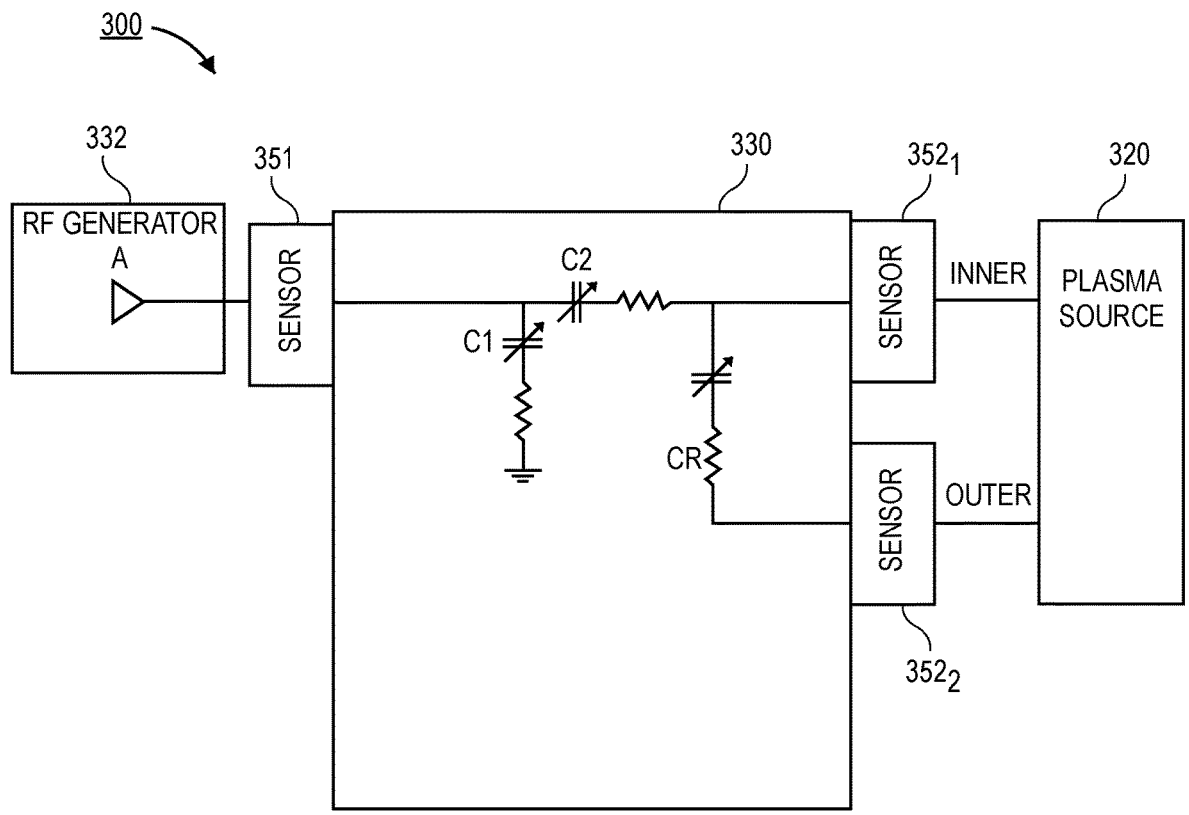
FIG. 3B is a schematic of a plasma processing tool with a single power supply and a pair of outputs, in accordance with an embodiment.

Referring now to FIG. 3B, a schematic view illustration of a semiconductor processing tool 300 is shown, in accordance with an embodiment. In an embodiment, the semiconductor processing tool 300 comprises a power supply 332. The power supply 332 shown in FIG. 3B is an RF generator. Though, it is to be appreciated that other power supplies may be used in accordance with additional embodiments. In an embodiment, the power supply 332 may be coupled to a first sensor 351. The first sensor 351 may be on an upstream side of the impedance matching network 330. In an embodiment, the first sensor 351 is a voltage and current sensor. In an embodiment, the first sensor 351 may be followed by the impedance matching network 330.

The impedance matching network 330 may include a first capacitor C1 a second capacitor C2, and a third capacitor C3. The first capacitor C1, the second capacitor C2, and the third capacitor C3 may be variable capacitors. The first capacitor C1 may be between an input to the impedance matching network 330 and a ground. The second capacitor C2 may be between the input to the impedance matching network 330 and a first output of the impedance matching network 330. The third capacitor C3 may be between the second capacitor C2 and a second output of the impedance matching network 330. For example, the first output may be used for an inner portion of the plasma source, and the second output may be used for an outer portion of the plasma source. Controlling the capacitance of the third capacitor C3 determines the splitting of power between the inner portion of the plasma source and the outer portion of the plasma source.

In an embodiment, second sensors $352_1$ and $352_2$ may be provided between the impedance matching network 330 and the plasma source 320. In an embodiment, the second sensors $352_1$ and $352_2$ may be current and voltage sensors. In an embodiment, the first sensor 351 and the second sensors 352 may be coupled to a processing module (not shown) similar to the process power control modules described in greater detail above. In an embodiment, the second sensors 352 may be between the impedance matching network 330 and the plasma source 320. For example, the plasma source 320 may be a plasma processing chamber, such as a PECVD chamber, a PEALD chamber, a PVD chamber, or a plasma treatment chamber.

Figure 3C:
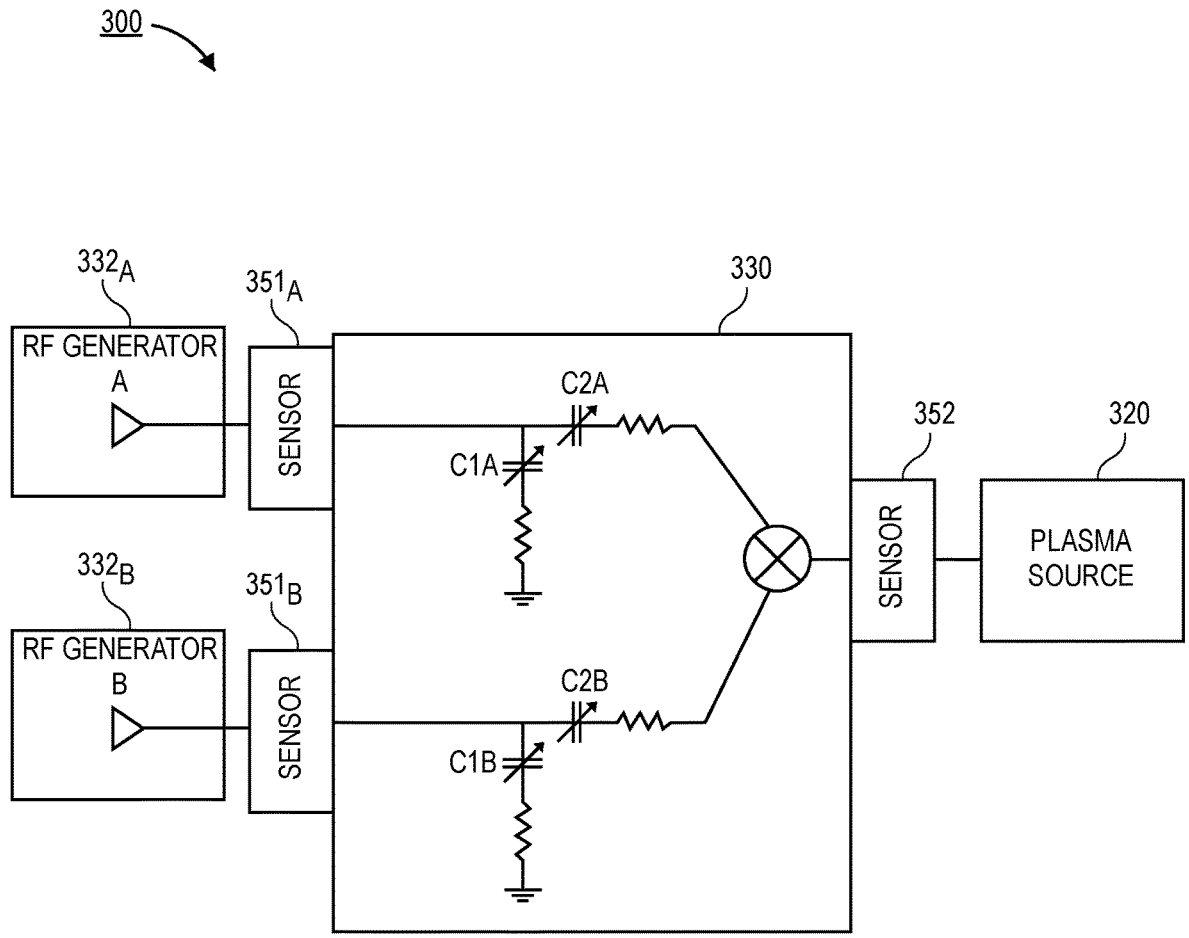
FIG. 3C is a schematic of a plasma processing tool with a pair of power supplies with a single output, in accordance with an embodiment.

Referring now to FIG. 3C, a schematic view illustration of a semiconductor processing tool 300 is shown, in accordance with an additional embodiment. In an embodiment, the semiconductor processing tool 300 includes a pair of power sources 332A and 332B. The power supplies 332A and 332B shown in FIG. 3C are RF generators. Though, it is to be appreciated that other power supplies may be used in accordance with additional embodiments. In an embodiment, the power supplies 332 may each be coupled to one of first sensors $351_A$ or $351_B$. The first sensors 351 may be on an upstream side of the impedance matching network 330. In an embodiment, the first sensors 351 are voltage and current sensors. In an embodiment, the first sensors 351 may be followed by the impedance matching network 330.

As shown, a pair of inputs are provided for the impedance matching network 330. The first input may be provided by the first power supply $332_A$, and the second input may be provided by the second power supply $332_B$. Each input of the impedance matching network 330 may include a first capacitor C1 and a second capacitor C2. The first capacitors C1 and the second capacitors C2 may be variable capacitors. The first capacitors C1 may be between an input to the impedance matching network 330 and a ground. The second capacitors C2 may be between the input to the impedance matching network 330 and an output of the impedance matching network 330. In an embodiment, the two input sources may merge together after the second capacitors C2 in order to provide a single output.

In an embodiment, the output of the impedance matching network 330 may be coupled to a second sensor 352. The second sensor 352 may be a voltage and current sensor. In an embodiment, the first sensors 351 and the second sensor 352 may be coupled to a processing module (not shown) similar to the process power control modules described in greater detail above. In an embodiment, the second sensor 352 may be between the impedance matching network 330 and the plasma source 320. For example, the plasma source 320 may be a plasma processing chamber, such as a PECVD chamber, a PEALD chamber, a PVD chamber, or a plasma treatment chamber.

Figure 3D:
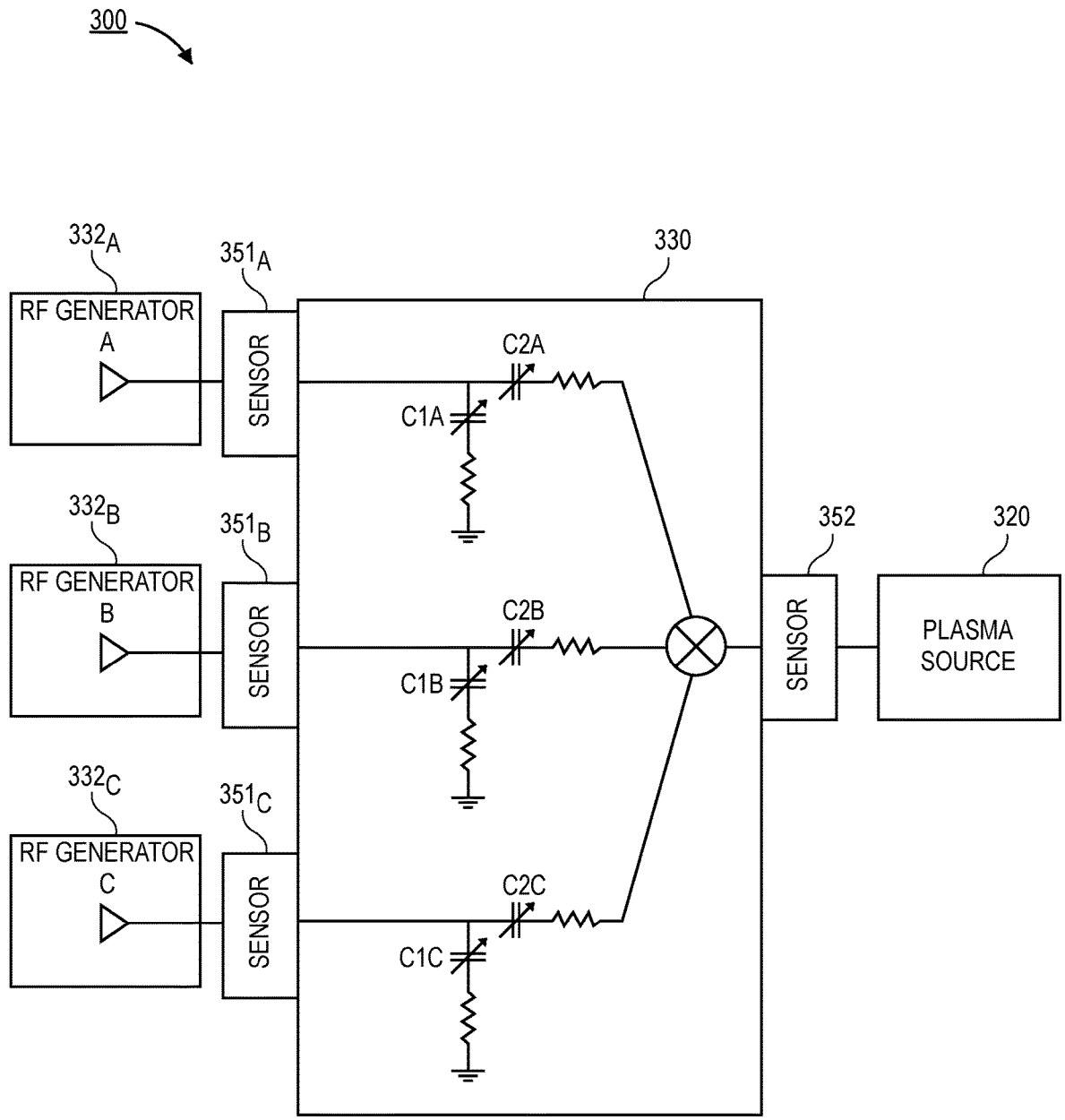
FIG. 3D is a schematic of a plasma processing tool with a set of three power supplies with a single output, in accordance with an embodiment.

Referring now to FIG. 3D, a schematic illustration of a semiconductor processing tool 300 is shown, in accordance with an embodiment. In an embodiment, the semiconductor processing tool 300 includes a set of three power sources $332_A$, $332_B$, and $332_C$. The power supplies $332_A$, $332_B$, and $332_C$ shown in FIG. 3D are RF generators. Though, it is to be appreciated that other power supplies may be used in accordance with additional embodiments. In an embodiment, the power supplies 332 may each be coupled to one of first sensors $351_A$, $351_B$, or $351_C$. The first sensors 351 may be on an upstream side of the impedance matching network 330. In an embodiment, the first sensors 351 are voltage and current sensors. In an embodiment, the first sensors 351 may be followed by the impedance matching network 330.

As shown, a set of three inputs are provided for the impedance matching network 330. The first input may be provided by the first power supply $332_A$, the second input may be provided by the second power supply $332_B$, and the third input may be provided by the third power supply $332_C$. Each input of the impedance matching network 330 may include a first capacitor C1 and a second capacitor C2. The first capacitors C1 and the second capacitors C2 may be variable capacitors. The first capacitors C1 may be between an input to the impedance matching network 330 and a ground. The second capacitors C2 may be between the input to the impedance matching network 330 and an output of the impedance matching network 330. In an embodiment, the three input sources may merge together after the second capacitors C2 in order to provide a single output.

In an embodiment, the output of the impedance matching network 330 may be coupled to a second sensor 352. The second sensor 352 may be a voltage and current sensor. In an embodiment, the first sensors 351 and the second sensor 352 may be coupled to a processing module (not shown) similar to the process power control modules described in greater detail above. In an embodiment, the second sensor 352 may be between the impedance matching network 330 and the plasma source 320. For example, the plasma source 320 may be a plasma processing chamber, such as a PECVD chamber, a PEALD chamber, a PVD chamber, or a plasma treatment chamber.

Figure 4:
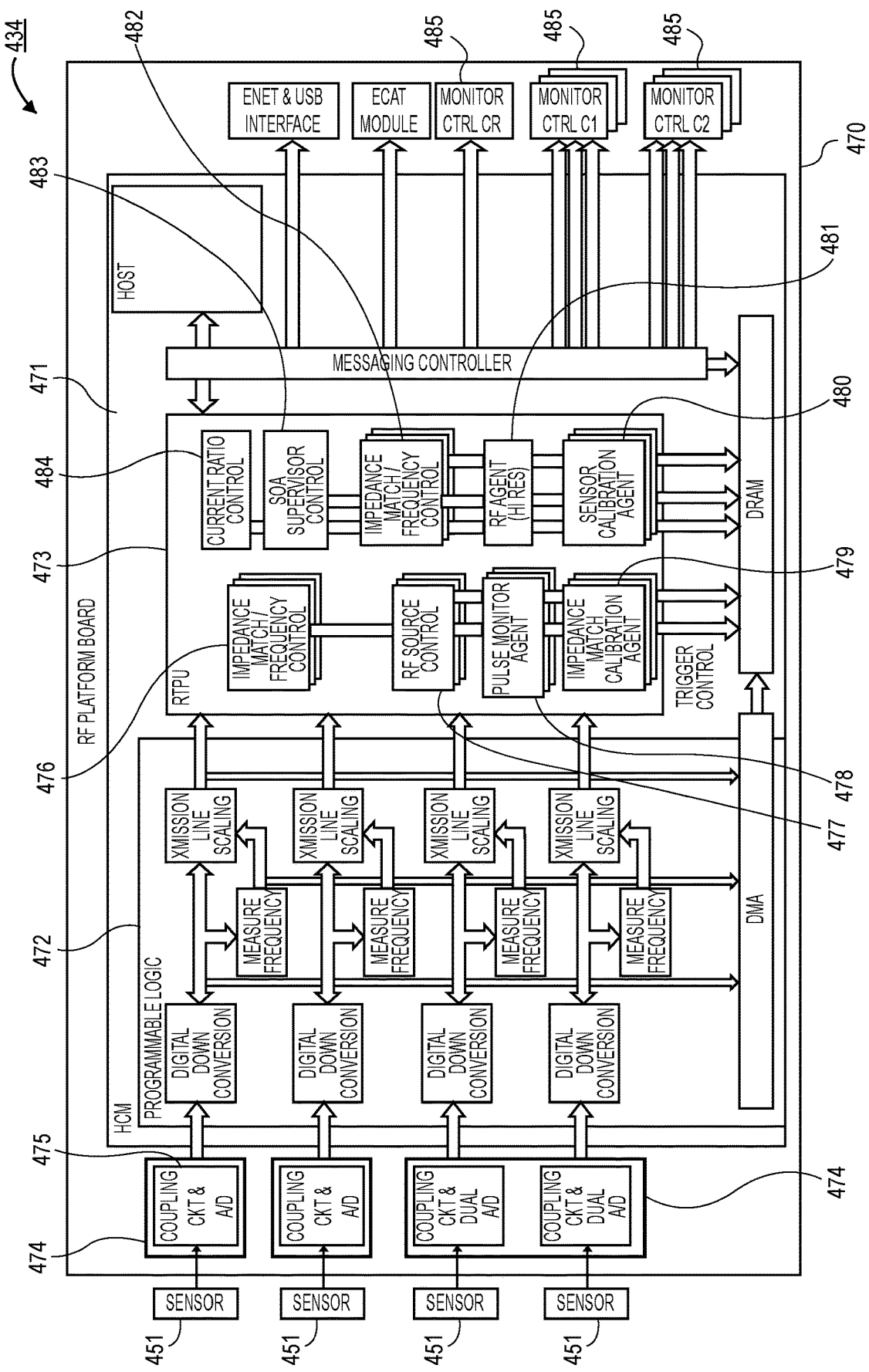
FIG. 4 is a schematic of a power processing module, in accordance with an embodiment.

Referring now to FIG. 4, a block diagram of a processing module 434 is shown, in accordance with an embodiment. In an embodiment, the processing module 434 may comprise a platform board 470, such as an RF platform board. In an embodiment, the platform board 470 may be a printed circuit board (PCB) or the like. In an embodiment, The platform board provides board to board connectors to support connectivity to the heterogeneous computing module (HCM) 471 and different combinations of dual ADCs 475. The HCM 471 may be a module constructed with high-performance, highly-integrated CPUs and programmable logic. The platform board 470 may support two Ethernet interfaces, such as an ECAT module and a USB (stored memory device). The platform board 470 may include actuator controllers 485 and drivers as required by the different use cases described above in FIGS. 3A-3D. In an embodiment, the platform board 470 may partition the voltage rails and supplies for the functionality on the platform board 470, the carrier cards 474, and the HCM 471.

In an embodiment, the platform board 470 may have two carrier cards 474 to support the variants of ADC 475 combinations. For a single sensor 451, only one carrier card 474 slot will be filled by an ADC assembly 475 and supporting RF coupling with passive components to the ADC 475 input. For a dual sensor 451 configuration, both carrier slots will be used with the coupling circuit and dual ADC 475. To scale to four sensor 451 inputs, the two independent carrier slots 474 are combined to form a solution to support two quad ADCs 475 or an eight input ADC 475.

In an embodiment, the HCM 471 comprises a programmable logic board 472 and a real-time processing unit (RTPU) board 473. The logic board 472 and the RTPU 473 may be coupled to memory devices (e.g., DRAM or the like). A messaging controller and a host may also be provided on the HCM 471.

In an embodiment, the RTPU 473 comprises an impedance match/frequency control block 476. The impedance match/frequency control block 476 is a processing component to compute position commands for variable capacitors and solid state tuning elements from transmission line measured values. In some embodiments, there may be up to three impedance match/frequency control blocks 476.

In an embodiment, the RTPU 473 may further comprises a current ratio control block 484. The current ratio control block 484 is a processing component to compute commands for a varying element to direct RF power between outputs. In some embodiments, RF currents are targeted. However, in other embodiments, voltage and/or phase values may also be controlled. In other embodiments, the current ratio control block 484 may be optionally omitted.

In an embodiment, the RTPU 473 may further comprise a safe operating area (SOA) supervisor control block 483. The SOA supervisor control block is a processing component to generate power and couple the RF power to the dynamic load. This subsystem may have an SOA associated with maximum dissipation, creepage, and clearance. In addition to generating warnings for operation in high dissipation loads, this processing module can proactively vary RF power.

In an embodiment, the RTPU 473 may further comprise an RF source control block 477. The RF source control block 477 may include components to control RF power set points based on measured RF quantified from the input and output sensors. RF set points are derived in CW and pulse modes. Compensation for line loss is incorporated in command set points to the RF power supply.

In an embodiment, the RTPU 473 may further comprise an impedance match/frequency agent block 482. In the case of cluster tools, multiple RF power delivery systems may be used. This agent provides a local computing engine to interface with a global supervisor to improve repeatability and reproducible performance on a cluster tool. Such an embodiment may be formulated with an evolving trellis that is shared with the supervising global agent.

In an embodiment, the RTPU 473 may further comprise a pulse monitor agent 478. The pulse monitor agent 478 may collect a statistical summary from a compilation of measured and computed pulse results. In an embodiment, the RTPU 473 may further comprise an RF agent 481. The RF agent 481 provides a set of configurable parameters for triggering a high resolution set of sequential samples. Trigger configurations are devised from different measured parameters with varying number of samples or acquisition time. In an embodiment, the RTPU 473 may further comprise an impedance match calibration agent 479. The impedance match calibration agent 479 governs the calibration of the impedance matching network. In an embodiment, the RTPU 473 may further comprise a sensor calibration agent 480. The sensor calibration agent 480 may govern the calibration of the RF sensors and sampling times for accurate frequency measurement.

Figure 5:
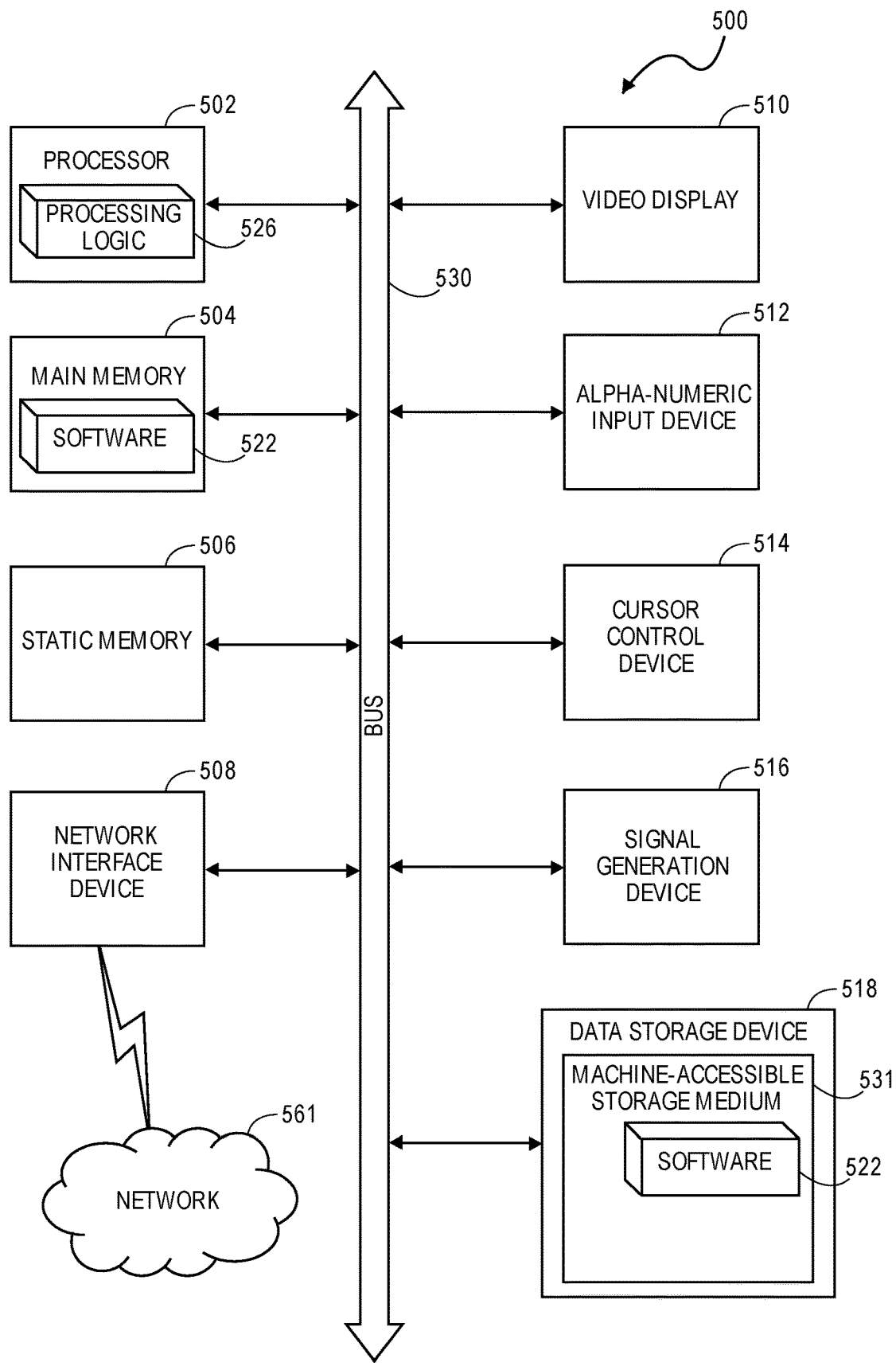
FIG. 5 illustrates a block diagram of an exemplary computer system that may be used in conjunction with a processing tool, in accordance with an embodiment.

Referring now to FIG. 5, a block diagram of an exemplary computer system 500 of a processing tool is illustrated in accordance with an embodiment. In an embodiment, computer system 500 is coupled to and controls processing in the processing tool. Computer system 500 may be connected (e.g., networked) to other machines in a Local Area Network (LAN), an intranet, an extranet, or the Internet. Computer system 500 may operate in the capacity of a server or a client machine in a client-server network environment, or as a peer machine in a peer-to-peer (or distributed) network environment. Computer system 500 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 500, the term "machine" shall also be taken to include any collection of machines (e.g., computers) that individually or jointly execute a set (or multiple sets) of instructions to perform any one or more of the methodologies described herein.

Computer system 500 may include a computer program product, or software 522, having a non-transitory machine-readable medium having stored thereon instructions, which may be used to program computer system 500 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 500 includes a system processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

System processor 502 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 502 may also be one or more special-purpose processing devices such as an application specific integrated circuit (ASIC), a field programmable gate array (FPGA), a digital signal system processor (DSP), network system processor, or the like. System processor 502 is configured to execute the processing logic 526 for performing the operations described herein.

The computer system 500 may further include a system network interface device 508 for communicating with other devices or machines. The computer system 500 may also include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium 532 (or more specifically a computer-readable storage medium) on which is stored one or more sets of instructions (e.g., software 522) embodying any one or more of the methodologies or functions described herein. The software 522 may also reside, completely or at least partially, within the main memory 504 and/or within the system processor 502 during execution thereof by the computer system 500, the main memory 504 and the system processor 502 also constituting machine-readable storage media. The software 522 may further be transmitted or received over a network 520 via the system network interface device 508. In an embodiment, the network interface device 508 may operate using RF coupling, optical coupling, acoustic coupling, or inductive coupling.

While the machine-accessible storage medium 532 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A processing tool, comprising:
a power supply;
an impedance matching network coupled to the power supply;
a cathode, wherein the power supply is configured to supply power through the impedance matching network to the cathode;
a processing module, wherein the processing module is communicatively coupled to the power supply and the impedance matching network;
a first sensor upstream of the impedance matching network; and
a second sensor downstream of the impedance matching network, the second sensor between the impedance matching network and the cathode.

2. The processing tool of claim 1, wherein the first sensor and the second sensor are communicatively coupled to the processing module.

3. The processing tool of claim 1, wherein the first sensor and the second sensor are voltage/current sensors.

4. The processing tool of claim 1, further comprising:
a plurality of power sources, wherein the plurality of power sources are coupled to the impedance matching network.

5. The processing tool of claim 4, further comprising:
a plurality of first sensors, wherein individual ones of the plurality of first sensors are between individual ones of the plurality of power sources and the impedance matching network; and
a second sensor between the impedance matching network and the cathode.

6. The processing tool of claim 1, wherein the cathode is in a plasma chamber.

7. The processing tool of claim 1, wherein the power supply is an RF power supply.

8. The processing tool of claim 1, wherein the power supply is a microwave power supply.

9. The processing tool of claim 1, wherein the power supply is a DC power supply.

10. The processing tool of claim 1, wherein the impedance matching network changes the impedance of the electrical path between the power supply and the cathode in order to match an impedance of a load coupled to the cathode.

11. The processing tool of claim 1, wherein the cathode is a top electrode in a plasma chamber.

12. The processing tool of claim 1, wherein the cathode is a bottom electrode in a plasma chamber.

13. A process power control module, comprising:
an RF platform board;
a carrier card for an analog to digital converter (ADC), the carrier card coupled to the RF platform board;
a heterogeneous computing module (HCM), the HCM coupled to the RF platform board;
a programmable logic board, the programmable logic board coupled to the RF platform board;
a real time processing unit (RTPU), the RTPU coupled to the RF platform board; and
a messaging controller, the messaging controller coupled to the RF platform board.

14. The process power control module of claim 13, wherein the RTPU comprises an impedance match/frequency control module.

15. The process power control module of claim 13, wherein the RTPU comprises a current ratio control module.

16. The process power control module of claim 13, wherein the RTPU comprises an RF source control module.

17. The process power control module of claim 13, wherein the RTPU comprises one or more of an impedance match/frequency agent, a pulse monitor agent, an impedance match calibration agent, and a sensor calibration agent.

18. A semiconductor processing tool, comprising:
a power supply;
an impedance matching network coupled to the power supply;
a cathode, wherein the power supply is configured to supply power through the impedance matching network to the cathode; and
a processing module, wherein the processing module is communicatively coupled to the power supply and the impedance matching network, and wherein the processing module comprises:
an RF platform board;
a carrier card for an analog to digital converter (ADC), the carrier card coupled to the RF platform board;

a heterogeneous computing module (HCM), the HCM
      coupled to the RF platform board;
   a programmable logic board, the programmable logic
      board coupled to the RF platform board;
   a real time processing unit (RTPU), the RTPU coupled
      to the RF platform board; and
   a messaging controller, the messaging controller
      coupled to the RF platform board; and
a first sensor upstream of the impedance matching network; and
a second sensor downstream of the impedance matching network, the second sensor between the impedance matching network and the cathode.

* * * * *